United States Patent
Anderson et al.

(10) Patent No.: US 11,870,538 B2
(45) Date of Patent: Jan. 9, 2024

(54) AMPLIFIER NETWORKS IN A REPEATER

(71) Applicant: Wilson Electronics, LLC, St. George, UT (US)

(72) Inventors: Dale Robert Anderson, Colleyville, TX (US); Christopher Ken Ashworth, Toquerville, UT (US); Ilesh V. Patel, Euless, TX (US); Glen Stewart Raggio, Mesquite, TX (US)

(73) Assignee: Wilson Electronics, LLC, St. George, UT (US)

( * ) Notice: Subject to any disclaimer, the term of this patent is extended or adjusted under 35 U.S.C. 154(b) by 178 days.

(21) Appl. No.: 17/393,919

(22) Filed: Aug. 4, 2021

(65) Prior Publication Data

US 2022/0045744 A1 Feb. 10, 2022

Related U.S. Application Data

(60) Provisional application No. 63/062,279, filed on Aug. 6, 2020.

(51) Int. Cl.
*H04B 7/155* (2006.01)

(52) U.S. Cl.
CPC .................................. *H04B 7/155* (2013.01)

(58) Field of Classification Search
CPC .. H04J 14/0204; H04J 14/0205; H04J 14/021; H04J 14/0212; H04N 21/40; H04N 21/414; H04N 21/426; H04Q 11/0005; H01Q 21/24
See application file for complete search history.

(56) References Cited

U.S. PATENT DOCUMENTS

| | | |
|---|---|---|
| 5,940,445 A | 8/1999 | Kamin, Jr. |
| 2004/0014500 A1 | 1/2004 | Chun |
| 2008/0129410 A1 | 6/2008 | Fukuda et al. |
| 2009/0149144 A1 | 6/2009 | Luz et al. |
| 2010/0148860 A1 | 6/2010 | Rhodes et al. |
| 2010/0166098 A1 | 7/2010 | Luz et al. |
| 2014/0015603 A1 | 1/2014 | Scott et al. |
| 2017/0302429 A1 | 10/2017 | Brighenti et al. |
| 2017/0338849 A1 | 11/2017 | Leinonen et al. |
| 2021/0376802 A1* | 12/2021 | Sharma ..................... H03F 1/56 |

FOREIGN PATENT DOCUMENTS

GB     2348331 A  *  9/2000  ............... H03F 1/32

* cited by examiner

*Primary Examiner* — Khalid W Shaheed
(74) *Attorney, Agent, or Firm* — Thorpe North & Western, LLP.

(57) ABSTRACT

Technology for a repeater with a trumped amplifier network is disclosed. The repeater can include two or more signal paths corresponding to two or more bands. The repeater can include a first coupler network communicatively coupled to the two or more signal paths. The repeater can include a second coupler network communicatively coupled to an antenna port. The repeater can include two or more amplifier networks between the first coupler network and the second coupler network. A signal received via the first coupler network can be distributed to the two or more amplifier networks for amplification and combined using the second coupler network to produce an amplified output signal.

28 Claims, 12 Drawing Sheets

AMPLIFIER NETWORKS IN A REPEATER

BACKGROUND

Signal boosters and repeaters can be used to increase the quality of wireless communication between a wireless device and a wireless communication access point, such as a cell tower. Signal boosters can improve the quality of the wireless communication by amplifying, filtering, and/or applying other processing techniques to uplink and downlink signals communicated between the wireless device and the wireless communication access point.

As an example, the signal booster can receive, via an antenna, downlink signals from the wireless communication access point. The signal booster can amplify the downlink signal and then provide an amplified downlink signal to the wireless device. In other words, the signal booster can act as a relay between the wireless device and the wireless communication access point. As a result, the wireless device can receive a stronger signal from the wireless communication access point. Similarly, uplink signals from the wireless device (e.g., telephone calls and other data) can be directed to the signal booster. The signal booster can amplify the uplink signals before communicating, via an antenna, the uplink signals to the wireless communication access point.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein.

Figure 1:
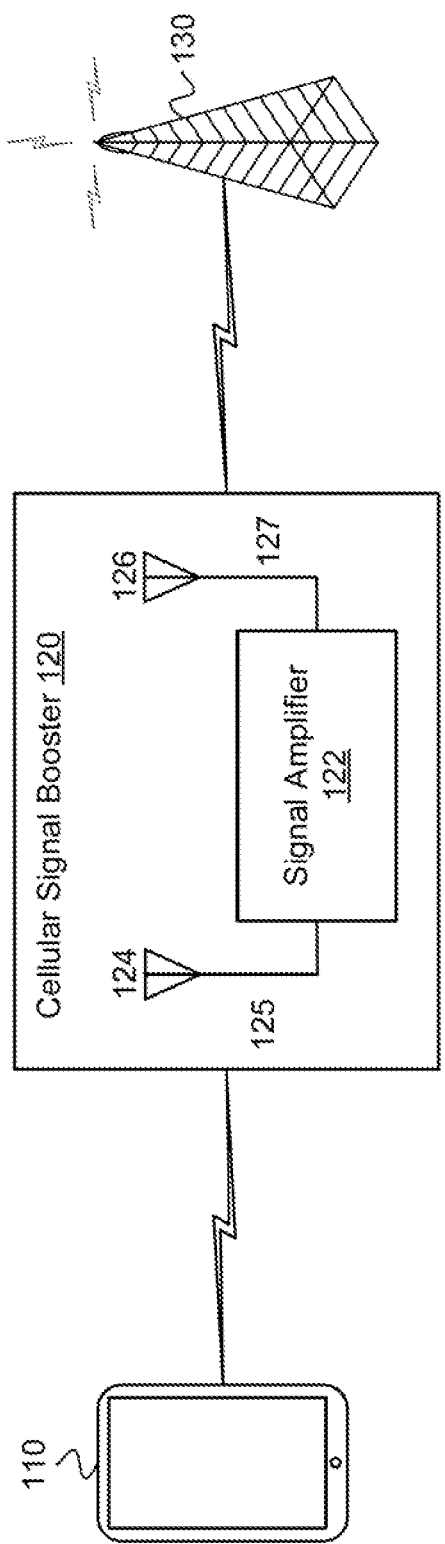
FIG. 1 illustrates a signal booster in communication with a wireless device and a base station in accordance with an example.

Reference will now be made to the exemplary embodiments illustrated, and specific language will be used herein to describe the same. It will nevertheless be understood that no limitation of the scope of the invention is thereby intended.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

FIG. 1 illustrates an exemplary signal booster 120 in communication with a wireless device 110 and a base station 130. The signal booster 120 can be referred to as a repeater. A repeater can be an electronic device used to amplify (or boost) signals. The signal booster 120 (also referred to as a cellular signal amplifier) can improve the quality of wireless communication by amplifying, filtering, and/or applying other processing techniques via a signal amplifier 122 to uplink signals communicated from the wireless device 110 to the base station 130 and/or downlink signals communicated from the base station 130 to the wireless device 110. In other words, the signal booster 120 can amplify or boost uplink signals and/or downlink signals bi-directionally. In one example, the signal booster 120 can be at a fixed location, such as in a home or office. Alternatively, the signal booster 120 can be attached to a mobile object, such as a vehicle or a wireless device 110.

In one configuration, the signal booster 120 can include an integrated device antenna 124 (e.g., an inside antenna or a coupling antenna) and an integrated node antenna 126 (e.g., an outside antenna). The integrated node antenna 126 can receive the downlink signal from the base station 130. The downlink signal can be provided to the signal amplifier 122 via a second coaxial cable 127 or other type of radio frequency connection operable to communicate radio frequency signals. The signal amplifier 122 can include one or more cellular signal amplifiers for amplification and filtering. The downlink signal that has been amplified and filtered can be provided to the integrated device antenna 124 via a first coaxial cable 125 or other type of radio frequency connection operable to communicate radio frequency signals. The integrated device antenna 124 can wirelessly communicate the downlink signal that has been amplified and filtered to the wireless device 110.

Similarly, the integrated device antenna 124 can receive an uplink signal from the wireless device 110. The uplink signal can be provided to the signal amplifier 122 via the first coaxial cable 125 or other type of radio frequency connection operable to communicate radio frequency signals. The signal amplifier 122 can include one or more cellular signal amplifiers for amplification and filtering. The uplink signal that has been amplified and filtered can be provided to the integrated node antenna 126 via the second coaxial cable 127 or other type of radio frequency connection operable to communicate radio frequency signals. The integrated device antenna 126 can communicate the uplink signal that has been amplified and filtered to the base station 130.

In one example, the signal booster 120 can filter the uplink and downlink signals using any suitable analog or digital filtering technology including, but not limited to, surface acoustic wave (SAW) filters, bulk acoustic wave (BAW) filters, film bulk acoustic resonator (FBAR) filters, ceramic filters, waveguide filters or low-temperature co-fired ceramic (LTCC) filters.

In one example, the signal booster 120 can send uplink signals to a node and/or receive downlink signals from the node. The node can comprise a wireless wide area network (WWAN) access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or another type of WWAN access point.

In one configuration, the signal booster 120 used to amplify the uplink and/or a downlink signal is a handheld booster. The handheld booster can be implemented in a sleeve of the wireless device 110. The wireless device sleeve can be attached to the wireless device 110, but can be removed as needed. In this configuration, the signal booster 120 can automatically power down or cease amplification when the wireless device 110 approaches a particular base station. In other words, the signal booster 120 can determine to stop performing signal amplification when the quality of uplink and/or downlink signals is above a defined threshold based on a location of the wireless device 110 in relation to the base station 130.

In one example, the signal booster 120 can include a battery to provide power to various components, such as the signal amplifier 122, the integrated device antenna 124 and the integrated node antenna 126. The battery can also power the wireless device 110 (e.g., phone or tablet). Alternatively, the signal booster 120 can receive power from the wireless device 110.

In one configuration, the signal booster 120 can be a Federal Communications Commission (FCC)-compatible consumer signal booster. As a non-limiting example, the signal booster 120 can be compatible with FCC Part 20 or 47 Code of Federal Regulations (C.F.R.) Part 20.21 (Mar. 21, 2013). In addition, the signal booster 120 can operate on the frequencies used for the provision of subscriber-based services under parts 22 (Cellular), 24 (Broadband PCS), 27 (AWS-1, 700 MHz Lower A-E Blocks, and 700 MHz Upper C Block), and 90 (Specialized Mobile Radio) of 47 C.F.R. The signal booster 120 can be configured to automatically self-monitor its operation to ensure compliance with applicable noise and gain limits. The signal booster 120 can either self-correct or shut down automatically if the signal booster's operations violate the regulations defined in FCC Part 20.21.

In one configuration, the signal booster 120 can improve the wireless connection between the wireless device 110 and the base station 130 (e.g., cell tower) or another type of wireless wide area network (WWAN) access point (AP). The signal booster 120 can boost signals for cellular standards, such as the Third Generation Partnership Project (3GPP) Long Term Evolution (LTE) Release 8, 9, 10, 11, 12, 13, 14, 15, or 16, 3GPP 5G Release 15 or 16, or Institute of Electronics and Electrical Engineers (IEEE) 802.16. In one configuration, the repeater 220 can boost signals for 3GPP LTE Release 16.0.0 (January 2019) or other desired releases. The signal booster 120 can boost signals from the 3GPP Technical Specification (TS) 36.101 (Release 15 Sep. 2017) bands or LTE frequency bands. For example, the signal booster 120 can boost signals from the LTE frequency bands: 2, 4, 5, 12, 13, 17, 25, and 26. In addition, the signal booster 120 can boost selected frequency bands based on the country or region in which the signal booster is used, including any of bands 1-85 or other bands, as disclosed in 3GPP TS 36.104 V16.0.0 (January 2019).

In another configuration, the repeater 220 can boost signals from the 3GPP Technical Specification (TS) 38.104 (Release 15 Jan. 2019) bands or 5G frequency bands. In addition, the repeater 220 can boost selected frequency bands based on the country or region in which the repeater is used, including any of bands n1-n86, n257-n261, or other bands, as disclosed in 3GPP TS 38.104 V15.4.0 (January 2019).

The number of 3GPP LTE or 5G frequency bands and the level of signal improvement can vary based on a particular wireless device, cellular node, or location. Additional domestic and international frequencies can also be included to offer increased functionality. Selected models of the signal booster 120 can be configured to operate with selected frequency bands based on the location of use. In another example, the signal booster 120 can automatically sense from the wireless device 110 or base station 130 (or GPS, etc.) which frequencies are used, which can be a benefit for international travelers.

In one configuration, multiple signal boosters can be used to amplify UL and DL signals. For example, a first signal booster can be used to amplify UL signals and a second signal booster can be used to amplify DL signals. In addition, different signal boosters can be used to amplify different frequency ranges.

In one configuration, the signal booster 120 can be configured to identify when the wireless device 110 receives a relatively strong downlink signal. An example of a strong downlink signal can be a downlink signal with a signal strength greater than approximately −80 decibel-milliwatts (dBm). The signal booster 120 can be configured to automatically turn off selected features, such as amplification, to conserve battery life. When the signal booster 120 senses that the wireless device 110 is receiving a relatively weak downlink signal, the integrated booster can be configured to provide amplification of the downlink signal. An example of a weak downlink signal can be a downlink signal with a signal strength less than −80 dBm.

In one example, a 5-band repeater or signal booster can have a direct-connect configuration, in which the repeater can have a single source such as a modem. For example, the modem can be amplified by multiple bands, and amplified signals can be transmitted via an outside antenna or donor antenna of the repeater. For a repeater that has a direct-connect configuration, the repeater can operate at one frequency at a time.

In existing solutions, the repeater having the direct-connect configuration can have a maximum uplink power capability of approximately 24 dBm, which is less than a ½ watt. However, a number of the cellular modems or radios intended to be coupled to the repeater can be capable of a similar uplink power, which can limit the value of the repeater. Therefore, it is desirable to increase the maximum uplink power of the repeater to a maximum allowable FCC 20.21 limit of 30 dBm (or about 1 W), which may exceed the uplink power capability provided by many cellular modems and radios, thereby providing considerably more value to the repeater and allowing coupled modems/radios to reach cell towers that are at a farther distance.

In order to achieve the higher uplink power of 30 dBm, one approach is to combine in parallel new radio frequency power amplifier components. However, this approach can increase a cost of the repeater as well as increase a size of an existing form factor, therefore necessitating a new case or chassis for the repeater.

In the technology described herein, in order to achieve the higher uplink power of 30 dBm, a trunked or shared amplifier solution can be used by the repeater to minimize a number of amplifier devices (e.g., power amplifier devices) that are used by the repeater, thereby not significantly adding to the cost of the repeater nor increasing the size of the repeater.

Figure 2:
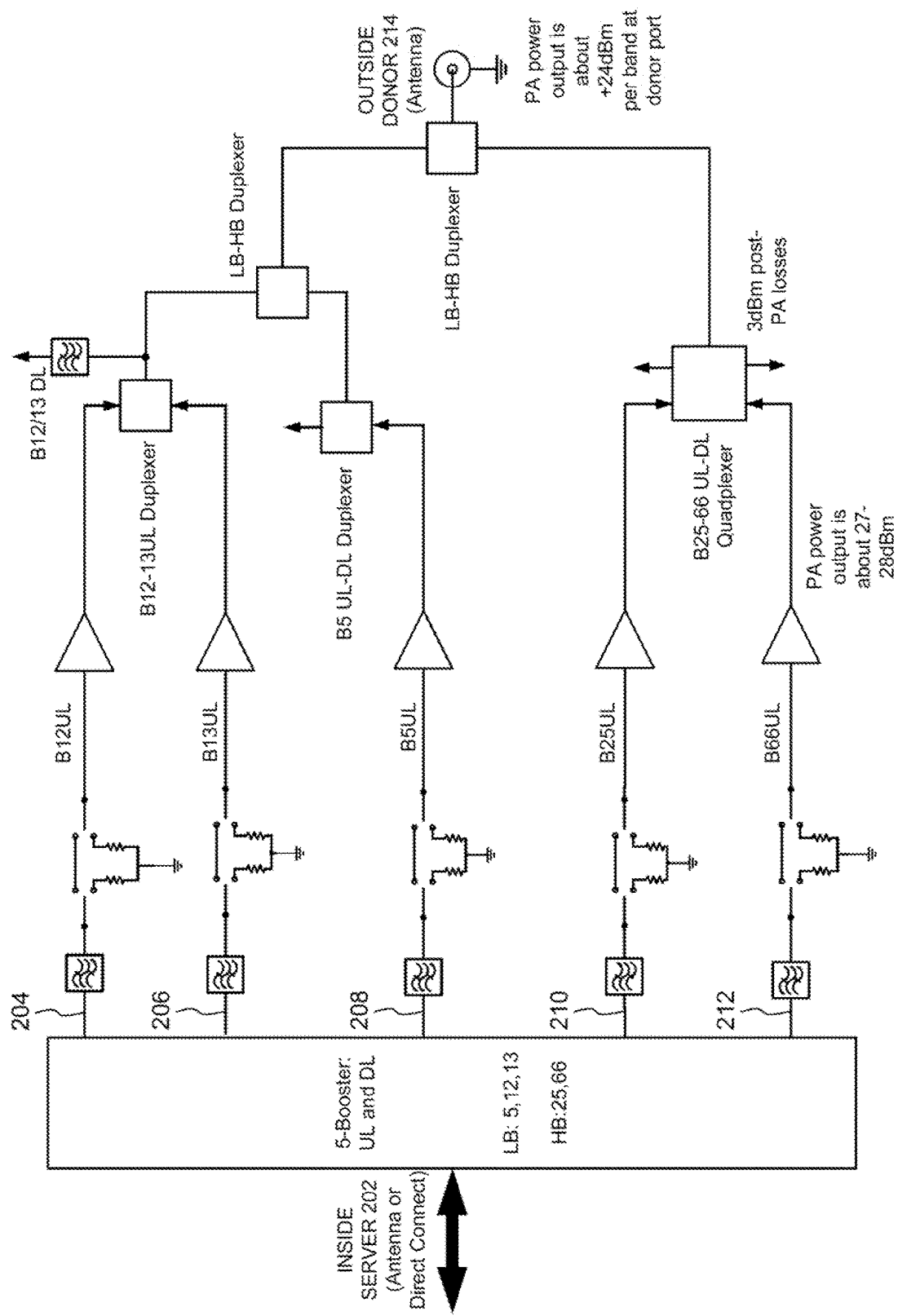
FIG. 2 illustrates a diagram of a standard repeater that includes uplink power amplifiers in accordance with an example.

FIG. 2 illustrates an example diagram of a standard repeater that includes uplink power amplifiers. In this example, the repeater can be a 5-band repeater. On one end of the repeater, the repeater can be connected to an inside server 202 via an antenna or via a direct connect, in which case the repeater can be connected to a modem. On the other end of the repeater, the repeater can be connected to an outside donor antenna 214.

In one example, the standard repeater can have multiple uplink signal paths, such as a first uplink signal path 204 corresponding to B12, a second uplink signal path 206 corresponding to B13, a third uplink signal path 208 corresponding to B5, a fourth uplink signal path 210 corresponding to B25, and a fifth uplink signal path 212 corresponding to B66. Each of the first, second, third, fourth and fifth signal paths 204, 206, 208, 210, 212 can include a power amplifier.

In one example, in the standard repeater, a power amplifier maximum linear output power can be about +27 dBM to +28 dBM. In other words, a power amplifier power output at the first uplink signal path 204 corresponding to B12, the second uplink signal path 206 corresponding to B13, etc., can be about +27 dBM to +28 dBM. Based on duplexers, quadplexers, etc. included the repeater after the power amplifiers, post-power amplifier losses in the repeater can be approximately 3 dBM. Therefore, the repeater can have a power output of about +24 dBM per band at a donor port associated with the outside donor antenna.

In the example shown in FIG. 2, only the uplink stages are shown for clarity, but the repeater in FIG. 2 can include downlink stages that are similar to the uplink stages.

With the standard repeater design that has a power output of about +24 dBM per band, to meet the desired higher uplink power of +30 dBm (or about 1 W) per band, the power amplifier maximum linear output power should be increased to about +33 dBm, which is a 5-6 dBM increase per band as compared to the standard repeater design. To achieve the value of +33 dBm, each band could have 3-4 combined power amplifier devices.

In one example, the power amplifiers can be low voltage, high gain, high efficiency and linear monolithic microwave integrated circuit (MMIC) devices. The power amplifiers can be based on indium gallium phosphide (InGaP) hetero-junction-bipolar-transistor (HBT), InGap bipolar-and-field-effect transistor (BiFET), and gallium arsenide (GaAs) technology. The power amplifiers can have a reduced cost and can be easily available since these types of power amplifiers devices are used in cellular handsets designs. The small size of these types of power amplifiers makes them attractive to combine to achieve higher power amplifier power, as opposed to using other technologies such as laterally-diffused metal-oxide semiconductor (LDMOS) or gallium nitride (GaN) which would likely result in a larger, more costly, less efficient/linear power amplifiers.

Figure 3:
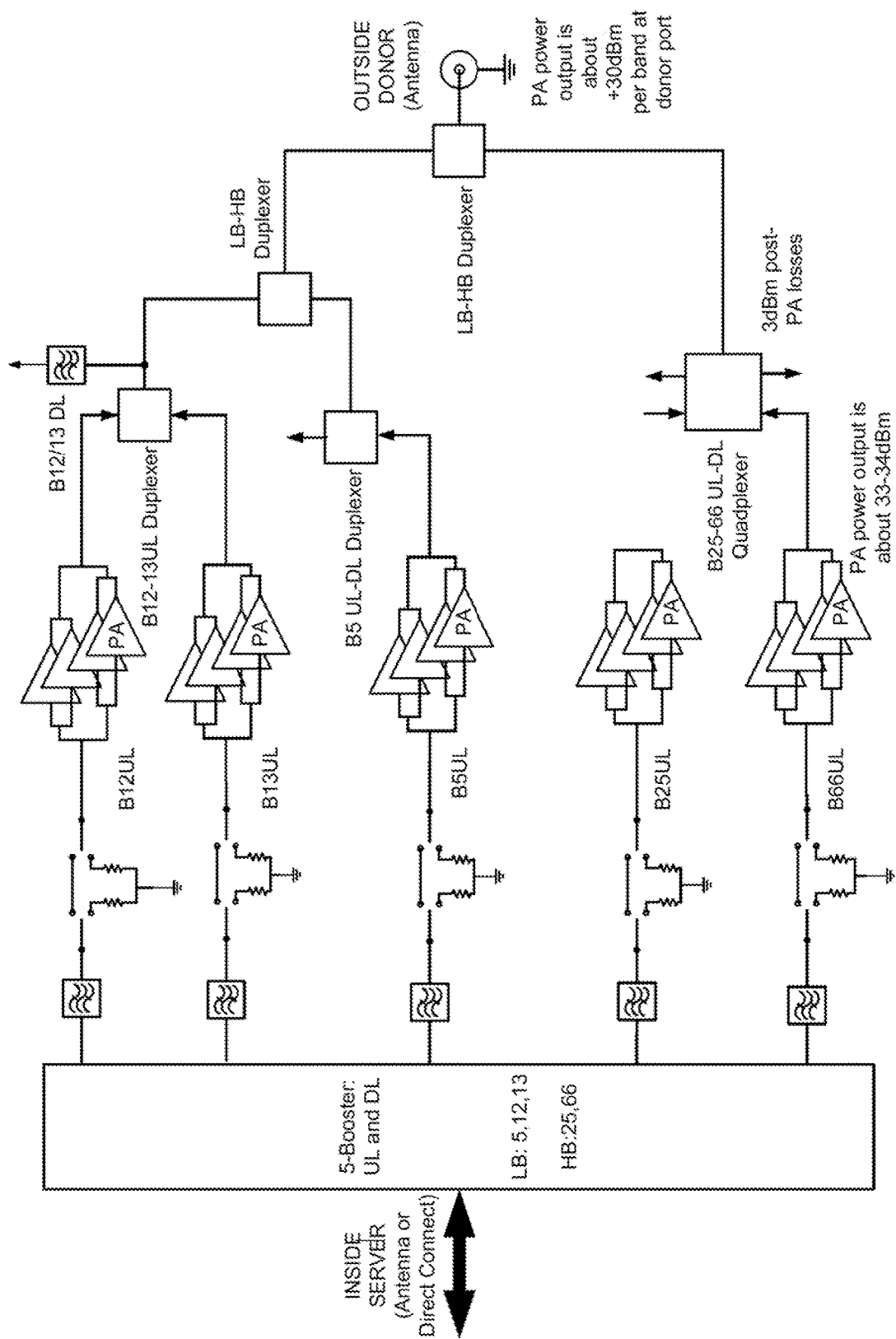
FIG. 3 illustrates a diagram of a repeater that includes uplink combined power amplifiers in accordance with an example.

FIG. 3 illustrates an example diagram of a repeater that includes uplink combined power amplifiers. In this example, to meet the desired higher uplink power of +30 dBm (or about 1 W) per band, four power amplifiers can be combined on an uplink signal path corresponding to a given band, which can result in a boosted uplink power of 6 dBm per uplink signal path. In this example, a power amplifier maximum linear output power can be about +33 dBM to +34 dBM. Further, post-power amplifier losses in the repeater can be approximately 3-4 dBM (which can include combining loss), so the repeater can have a power output of about +30 dBM per band at a donor port associated with the outside donor antenna.

However, in the example shown in FIG. 3, each uplink signal path can have four power amplifiers, and for a 5-band repeater, a total of 20 power amplifiers can be used to achieve the desired higher uplink power of +30 dBm (or about 1 W) per band. The 20 total power amplifiers are 15 more than the standard repeater design that achieved +24 dBM per band, and could add considerably to the cost and/or size of the repeater.

Figure 4:
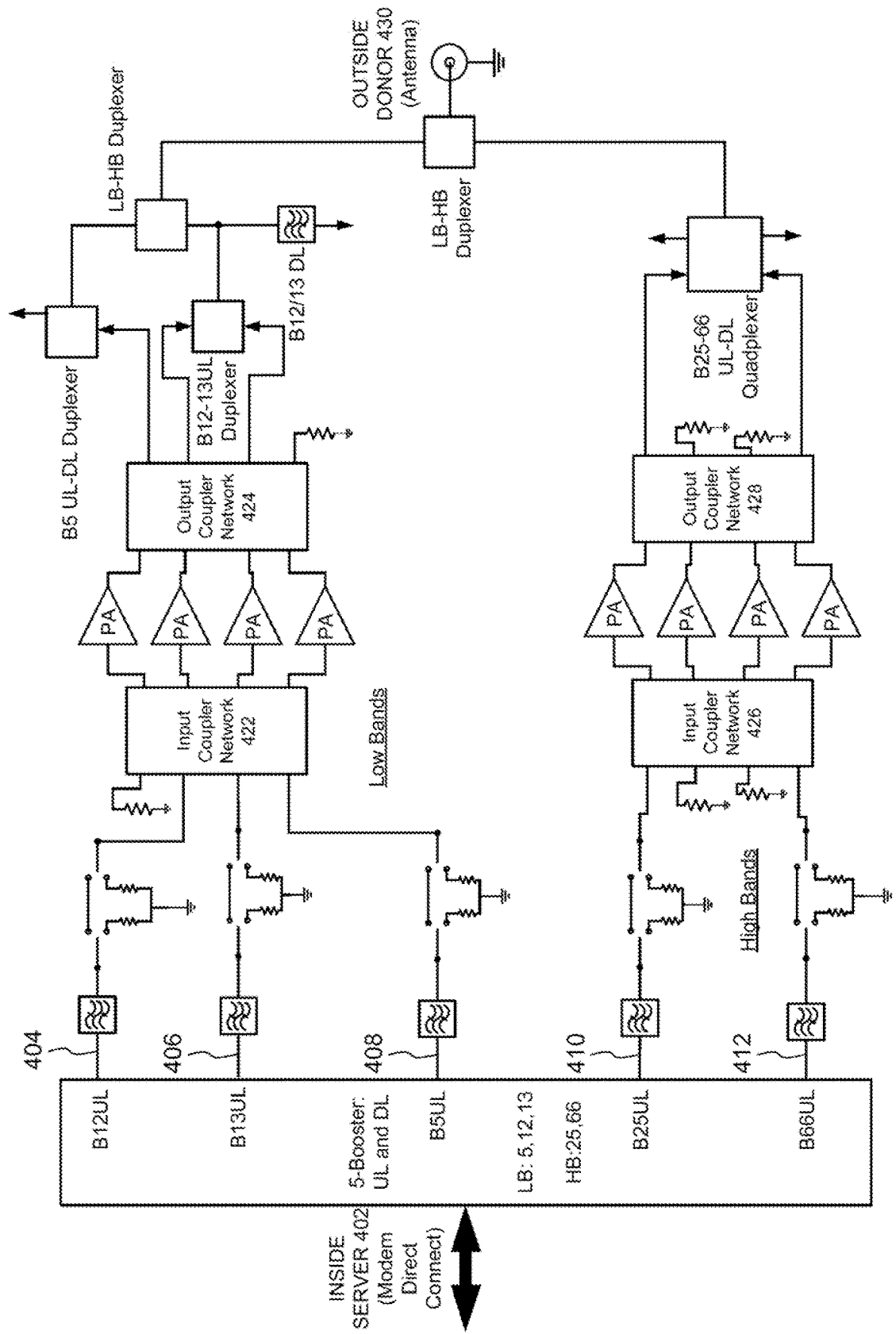
FIG. 4 illustrates a diagram of a repeater that includes uplink amplifier networks in accordance with an example.

FIG. 4 illustrates an example diagram of a repeater that includes uplink amplifier networks. In this example, the repeater can be a 5-band repeater. On one end of the repeater, the repeater can be connected to an inside server 402 through a modem direct connect. On the other end of the repeater, the repeater can be connected to an outside donor antenna 430. As described in further detail below, the repeater can employ a trunked or shared amplifier network design, which can enable an amplified output signal produced by the repeater to have an increased power output of approximately 30 decibel-milliwatts (dBm) per band in accordance with a maximum allowable limit under 47 Code of Federal Regulations (CFR) Section 20.21.

In one example, the repeater can have multiple uplink signal paths, such as a first uplink signal path 404 corresponding to B12, a second uplink signal path 406 corresponding to B13, a third uplink signal path 408 corresponding to B5, a fourth uplink signal path 410 corresponding to B25, and a fifth uplink signal path 412 corresponding to B66. The first, second and third uplink signal paths 404, 406, 408 corresponding to B12, B13 and B5, respectively, can correspond to low bands. The fourth and fifth uplink signal paths 410, 412 corresponding to B25 and B66, respectively, can correspond to high bands.

In one example, the repeater can include additional uplink signal paths corresponding to low bands or high bands other than B12, B13, B5, B25 and B66. For example, the repeater can include an additional uplink signal path corresponding to B71, which is considered a low band.

In one example, the first, second and third uplink signal paths 404, 406, 408 corresponding to B12, B13 and B5, respectively, can be communicatively coupled to an input coupler network 422. The input coupler network 422 can also be referred to as an input splitting network. The input coupler network 422 can be communicatively coupled to two or more amplifier networks. In this example, the input coupler network 422 can be communicatively coupled to four amplifier networks. Further, in this example, a given amplifier network can include a power amplifier. The four amplifier networks or four power amplifiers can be shared or trunked between uplink signal paths corresponding to different bands. Alternatively, a given amplifier network can include a single transistor device or a gain block representing a low noise amplifier (LNA) or another device providing signal amplification. The amplifier networks can be communicatively coupled to an output coupler network 424. The output coupler network 424 can also be referred to as an output combining network. The output coupler network 424 can be communicatively coupled to the outside donor antenna 430. In other words, the output coupler network 424 may not be directly coupled to the outside donor antenna 430, but rather can be indirectly coupled to the outside donor antenna 430 via duplexers, quadplexers or other circuit elements. Further, the output coupler network 424 can be directly coupled to one or more additional signal paths corresponding to one or more bands, circuit elements such as filters, isolator/circulators, etc.

Similarly, the fourth and fifth signal paths 410, 412 corresponding to B25 and B66, respectively, can be communicatively coupled to a second input coupler network 426. The second input coupler network 426 can be communicatively coupled to four amplifier networks. The amplifier networks can be communicatively coupled to a second output coupler network 428. The second output coupler network 428 can be communicatively coupled to the outside donor antenna 430.

In one example, a first input coupler network, a first set of amplifier networks and a first output coupler network can be associated with multiple signal paths associated with low bands, whereas a second input coupler network, a second set of amplifier networks and a second output coupler network can be associated with multiple signal paths associated with high bands. As a result, amplifier networks (e.g., power amplifiers) can be shared or trunked between signal paths, thereby reducing the total number of power amplifiers used in the repeater.

In one example, an uplink signal can be provided to an input coupler network. The input coupler network can split the uplink signal into a number of sub-signals, depending on a number of amplifier networks or power amplifiers that are communicatively coupled to the input coupler network. Each amplifier network can amplify a given sub-signal, and amplified sub-signals can be provided to an output coupler network. The output coupler network can combine the amplified sub-signals to produce an amplified uplink output signal.

As a non-limiting example, a B12 uplink signal can be received from a modem, and the B12 uplink signal can be directed onto a B12 uplink signal path. The B12 uplink signal can be provided to the input coupler network associated with the B12 uplink signal path. The input coupler network can split the B12 uplink signal into a defined number of sub-signals, depending on a number of amplifier networks (e.g., power amplifiers). In this example, the input coupler network can split the B12 uplink signal into four sub-signals based on the four amplifier networks (e.g., four power amplifiers) communicatively coupled to the input coupler network. The sub-signals can be spread or distributed equally (or nearly equally) across the four amplifier networks (e.g., four power amplifiers), and each of the four amplifier networks can provide an equal amount of signal amplification. Thus, each amplifier network can amplify a sub-signal, and four amplified sub-signals can be provided to the output coupler network. The output coupler network can combine the four amplified sub-signals to produce an amplified uplink output signal. The amplified uplink output signal can be provided to an outside donor antenna for transmission to a base station.

In one example, in the example shown in FIG. 4, the desired higher uplink power of +30 dBm (or about 1 W) per band can be achieved using a total of four power amplifiers, as opposed to the repeater design described above in which 20 power amplifiers are used to achieve the desired higher uplink power of +30 dBm (or about 1 W) per band, thereby reducing the number of components in the repeater and thereby reducing costs associated with the repeater.

In the example shown in FIG. 4, the repeater can employ band trunked amplifier networks (or power amplifiers) using passive coupler splitting/combining. For example, by using coupler splitter/combiners arranged in a specific topology, amplifier networks (such as power amplifiers) can be shared or "trunked" between band paths. The trunked amplifier networks can serve as a shared resource for multiple uplink signal paths. For a direct connect repeater that operates on multiple bands, but occupies only a single band at a time, a band-trunked amplifier network can provide an efficient use of transmit resources. Further, trunking or sharing power amplifier resources across bands can reduce the amount of total amplifier network resources that are used in the repeater. For example, in the case of a mixed high/low 5-band booster, amplifier network resources (e.g., a number of power amplifiers) can be reduced by 60% as compared to using a traditional power amplifier combining approach.

In one example, as shown in FIG. 4, a first set of amplifier networks can be used for uplink signal paths associated with low bands, and a second set of amplifier networks can be used for uplink signal paths associated with high bands. In an alternative configuration, a common set of amplifier networks can be used for uplink signal paths associated with both low bands and high bands.

Figure 5A:
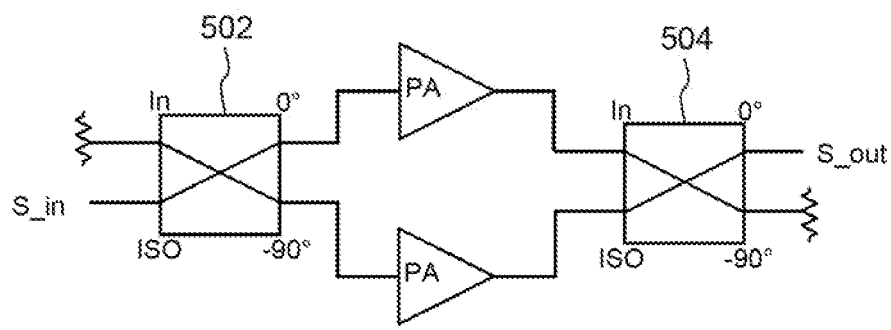
FIG. 5A illustrates a hybrid combined amplifier in accordance with an example.

FIG. 5A illustrates an example of a hybrid combined amplifier. In this example, a first hybrid coupler 502 can include a first input port and a second input port. The first input port can be terminated with a system impedance and the second input port can be associated with an input signal (S_in). The hybrid coupler can be communicatively coupled to a pair of power amplifiers. The pair of power amplifiers can be communicatively coupled to a second hybrid coupler 504. The second hybrid coupler 504 can include a first output port and a second output port. The first output port can be associated with an output signal (S-out) and the second output port can be terminated with a system impedance. In this example, since there are two power amplifiers to amplify the input signal, a single signal combined power amplifier signal power can be equal to two times of that of a power amplifier (in watts).

Figure 5B:
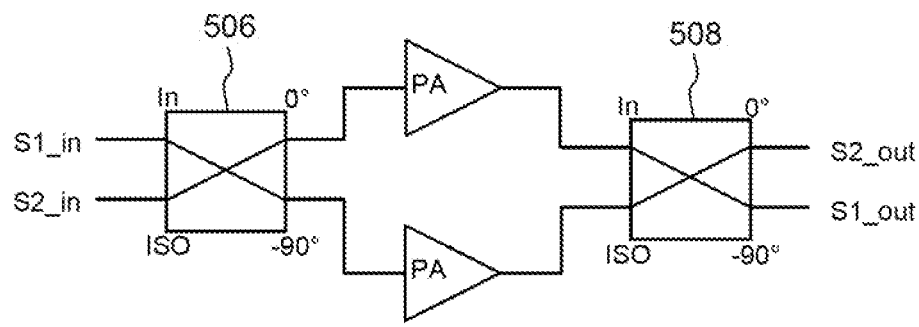
FIG. 5B illustrates a 2×2 trunked amplifier in accordance with an example.

FIG. 5B illustrates an example of a 2×2 trunked amplifier. In this example, a first hybrid coupler 506 can include a first input port and a second input port. The first input port can be terminated with a first input signal (S1_in) and the second input port can be associated with a second input signal (S2_in). The first input signal can be associated with a first band and the second input signal can be associated with a second band. The hybrid coupler can be communicatively coupled to a pair of power amplifiers. The pair of power amplifiers can be communicatively coupled to a second hybrid coupler 508. The second hybrid coupler 508 can include a first output port and a second output port. The first output port can be associated with a second output signal (S2_out) and the second output port can be associated with a first output signal (S1_out). In this example, for a two signal S1/S2 trunked amplifier, each signal can have a power equal to two times of that of a power amplifier (in watts), but not at a same time.

In one example, a simple trunked power amplifier (PA) case can involve taking hybrid combined power amplifiers (as shown in FIG. 5A) each of CPA watts and adding a second signal to an input coupler (as shown in FIG. 5B). As a result, two signals can be both trunked across the two power amplifiers. Further, each signal can drive the trunked PAs to 2×PA watts, but not at a same time. In the 2×2 trunked amplifier, the number of signals can be equal to the number of power amplifiers, so there can be no termination resistor. Further, a bandwidth of a trunked power amplifier structure can be limited by the power amplifier(s), hybrid combiner or both.

Figure 6A:
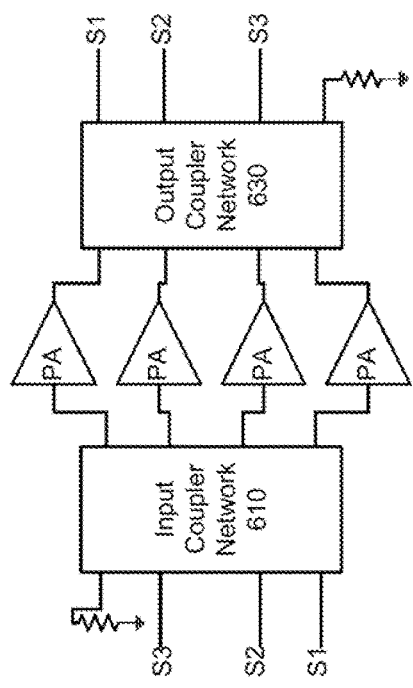
FIG. 6A illustrates a diagram of an input coupler network, two or more amplifier networks and an output coupler network in a repeater in accordance with an example.

FIG. 6A illustrates an example of an input coupler network 610, two or more amplifier networks and an output coupler network 630 in a repeater. The input coupler network 610 can include a first input port associated with an unused port termination, a second input port associated with a third signal (S3) in a third band, a third input port associated with a second signal (S2) in a second band, and a fourth input port associated with a first signal (S1) in a first band. The input coupler network 610 can be communicatively coupled to the two or more amplifier networks. In this example, the input coupler network 610 can be communicatively coupled to four amplifier networks. Further, in this example, each amplifier network can include a power amplifier. However, in another example, each amplifier network can include a single transistor device or a gain block representing a low noise amplifier (LNA) or another device providing signal amplification. The four amplifier networks can be communicatively coupled to the output coupler network 630. The output coupler network 630 can include a first output port associated with the first signal (S1) in the first band, a second output port associated with the second signal (S2) in the second band, a third output port associated with the third signal (S3) in the third band, and a fourth output port associated with an unused port termination.

Figure 6B:
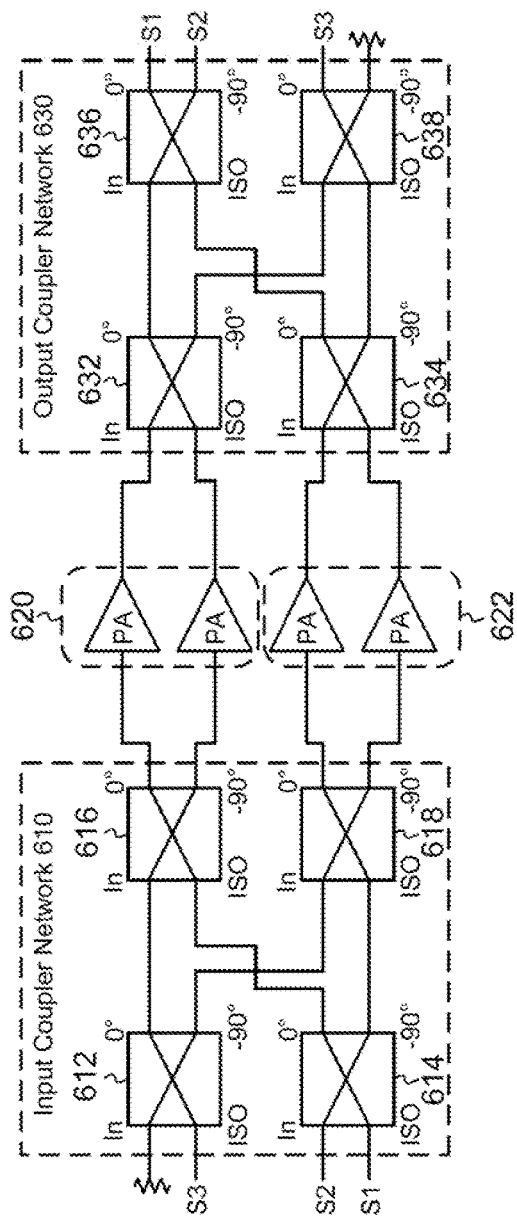
FIG. 6B illustrates an input coupler network that includes one or more hybrid couplers and an output coupler network that includes one or more hybrid couplers in a repeater in accordance with an example.

FIG. 6B illustrates an example of an input coupler network 610 that includes one or more hybrid couplers and an output coupler network 630 that includes one or more hybrid couplers in a repeater. The input coupler network 610 can also be referred to as a first coupler network and the output coupler network 630 can also be referred to as a second coupler network. In this example, the input coupler network 610 can include four separate hybrid couplers and the output coupler network 630 can include four separate hybrid couplers. In one example, the hybrid couplers can be 4-port 3 dB 90/180 degree directional couplers. Alternatively, the input coupler network 610 and the output coupler network 630 can include directional coupler structures with coupling values other than 3 dB and phase shifts other than +−90/180 degrees.

As shown in FIG. 6B, the input coupler network 610 can include a first hybrid coupler 612, a second hybrid coupler 614, a third hybrid coupler 616, and a fourth hybrid coupler 618. The first hybrid coupler 612 can include a first input port associated with an unused port termination, and a second input port associated with a third signal (S3) in a third band. The second hybrid coupler 614 can include a third input port associated with a second signal (S2) in a second band, and a fourth input port associated with a first signal (S1) in a first band. A first output port of the first hybrid coupler 612 can be communicatively coupled to a first input port of the third hybrid coupler 616, and a second output port of the first hybrid coupler 612 can be communicatively coupled to a first input port of the fourth hybrid coupler 618. Further, a first output port of the second hybrid coupler 614 can be communicatively coupled to a second input port of the third hybrid coupler 616, and a second output port of the second hybrid coupler 614 can be communicatively coupled to a second input port of the fourth hybrid coupler 618.

In one example, the first and second output ports of the third hybrid coupler 616 can be communicatively coupled to a first set of amplifier networks 620, and the first and second output ports of the fourth hybrid coupler 618 can be communicatively coupled to a second set of amplifier networks 622. In this example, the first set of amplifier networks 620 and the second set of amplifier networks 622 can each include two amplifier networks. Further, in this example, each amplifier network can include a power amplifier.

In one example, the first set of amplifier networks 620 can be communicatively coupled to first and second input ports of a fifth hybrid coupler 632, and the second set of amplifier networks 622 can be communicatively coupled to first and second input ports of a sixth hybrid coupler 634. A first output port of the fifth hybrid coupler 632 can be communicatively coupled to a first input port of a seventh hybrid coupler 636, and a second output port of the fifth hybrid coupler 632 can be communicatively coupled to a first input port of an eighth hybrid coupler 638. Further, a first output port of the sixth hybrid coupler 634 can be communicatively coupled to a second input port of the seventh hybrid coupler 636, and a second output port of the sixth hybrid coupler 634 can be communicatively coupled to a second input port of the eighth hybrid coupler 638. The seventh hybrid coupler 636 can include a first output port associated with the first signal (S1) in the first band, and a second output port associated with the second signal (S2) in the second band. The eighth hybrid coupler 638 can include a first output port associated with the third signal (S3) in the third band, and a second output port associated with the unused port termination.

In alternative configurations, any of the first, second, third and fourth input ports associated with the first hybrid coupler 612 and the second hybrid coupler 614 can be associated with an unused port termination or a band, and corresponding first, second, third and fourth output ports associated with the seventh hybrid coupler 636 and the eighth hybrid coupler 638 can be associated with an unused port termination or a band.

In other words, one or more input ports of the input coupling network 610 and one or more output ports of the output coupling network 630 can be configured to be terminated with a system impedance. The input/output ports of the generalized input/output coupling networks can be connected to a signal path or terminated in a system impedance. Further, a terminated input port can have a corresponding terminated output port. In some cases, a phase shift can be introduced between couplers or 180 degree hybrid couplers can be used to change where the input/output termination pairs occur, so the above configuration is not limited to the case of using 90 degree hybrid couplers.

In one example, a number of input paths to the input coupler network 610 can be equal to M and a number of amplifier networks can be equal to N, where M is less than or equal to N, and M and N are positive integers greater than or equal to two. In the example shown in FIG. 6B, the input coupler network 610 can receive signals in up to three bands so M=3, and there are a total of four amplifier networks in the first and second set of amplifier networks 620, 622 so N=4.

In one example, interconnected 90° hybrid combiners can be used for input splitting/output combining M signals driving a trunked or shared pool of N=4 power amplifiers. Generally speaking, the number of coupler network's input/output ports can be equal to "N" PAs, where there is no upper bound on N. The coupler network's N input port power can be split equally between all of the pooled power amplifiers. For example, if M<N signals are an input, the total linear power of all of the pooled power amplifiers can be split among the M signals.

In one example, for a single source direct connect booster, the power amplifier topology described herein can allow a single band (M=1) to drive a pool of N power amplifiers to their maximum combined linear power. In another example, for M being less than or equal to N (M<=N), the M input signals can drive any of the input coupler network's N inputs, and any non-driven N-M inputs/outputs can be terminated in the coupler's system $Z_0$. The M<=N input signals can appear as M signals on the coupler network's output, and the output ports where the M signals appear can be determined by the coupler's combining topology. In a further example, a portion of the intermodulation (IM) power generated in the pool of power amplifiers can appear at the terminated output port because the IM generated in each power amplifier may not correlate 100% when summed together in the output combiner network.

In one example, the split/combined pool of power amplifiers can be capable of amplifying the band(s) input. Separate low band and high band pools of amplifier networks (or power amplifiers) can be implemented based on power amplifier device bandwidths. However, in some cases, a single pool of ultra-wideband power amplifiers and couplers can be implemented to cover all frequency bands of the repeater.

In one example, the isolation of the combined coupler outputs (e.g., between the output signal ports of the output coupler network) from each other can be 25-40 dB when using typically available hybrid couplers and power amplifiers.

In one example, the input coupler network 610, the first and second set of amplifier networks 620, 622 and the output coupler network 630 can be included in a trunked amplifier network. The trunked amplifier network can be included in a repeater or signal booster. The trunked amplifier network can be communicatively coupled to a modem via one or more uplink signal paths, and the trunked amplifier network can be communicatively coupled to an outside donor antenna.

Figure 7:
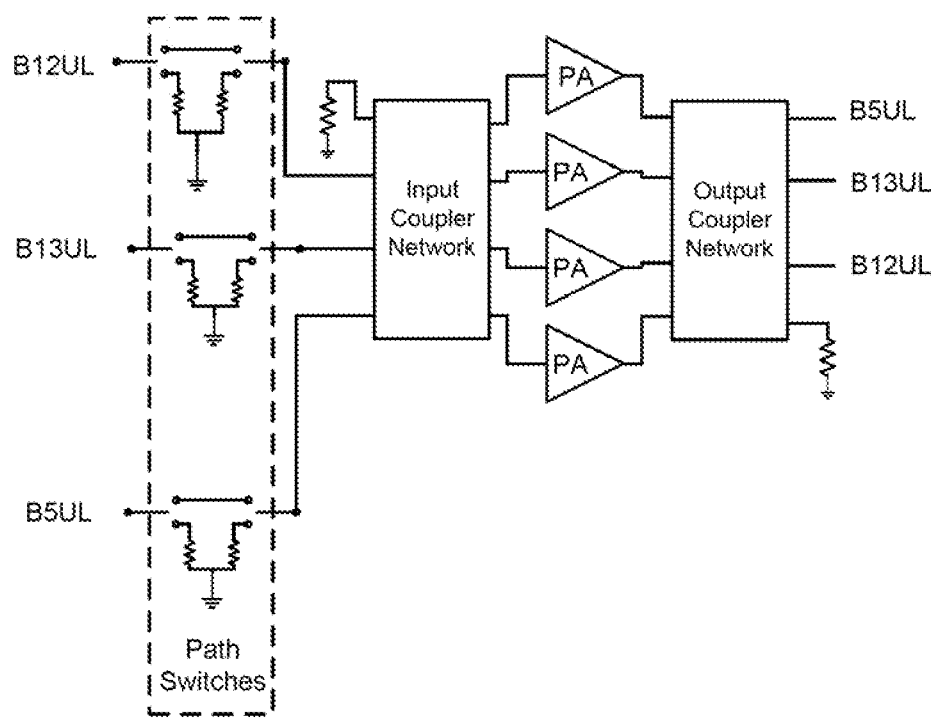
FIG. 7 illustrates one or more signal paths having a switch in accordance with an example.

FIG. 7 illustrates an example of one or more signal paths having a switch. The switch can be on a signal path prior to an input coupler network in a repeater. In this example, a B12 uplink signal path can include a switch prior to the input coupler network, a B13 uplink signal path can include a switch prior to the input coupler network, and a B5 uplink signal path can include a switch prior to the input coupler network. In this example, each of the uplink signal paths corresponding to B12, B13 and B5, respectively, can include a separate switch. Further, the input coupler network can be communicatively coupled to a set of amplifier networks (e.g., power amplifiers), and the set of amplifier networks can be communicatively coupled to an output coupler network.

In one example, for a given uplink signal path, a switch can be opened to enable a signal to pass through the uplink signal path, or the switch can be closed to terminate the uplink signal path with a matched load to enable the input coupler network and the output coupler network to continue operating for other bands. Further, for booster service, the switches can allow an uplink signal to pass or can shut down the uplink signal and noise from a specific band path, which can aid the case of oscillation detection or band shutdown.

In one example, during the course of direct connect operation where a source (e.g., modem) temporarily engages in simultaneous multi-band communication, a Received Signal Strength Indicator (RSSI) of each active band can be detected before entering a coupler input splitter and can be used to set an individual band's automatic gain control (AGC) below a maximum power AGC threshold, which can ensure that a total power processed by the pool of trunked power amplifiers is within the pool's maximum linear power limit.

In one configuration, a no-fault gain response of a trunked amplifier system can be determined. When a number of input paths (M) is less than a number of amplifier networks (N), any of the output combiner terminated ports can be used to detect an amplifier gain fault. Further, a low band fault detect gain can change considerably from a no-fault gain, and thus can be used to detect a fault in a pool of amplifier networks (or power amplifiers).

In one configuration, the repeater can employ a wideband match. For example, the wideband match can be adjustable depending on which band is strongest. As an example, if B5 has the strongest uplink input, then all of the trunked amplifier networks (or power amplifiers) can be matched to optimize the B5 uplink power. In another example, a different adjustable match can be used on each amplifier network (or power amplifier). As an example, if B5, B12, and B13 all have strong uplink inputs, then each amplifier network (or power amplifier) can potentially be matched differently.

Figure 8:
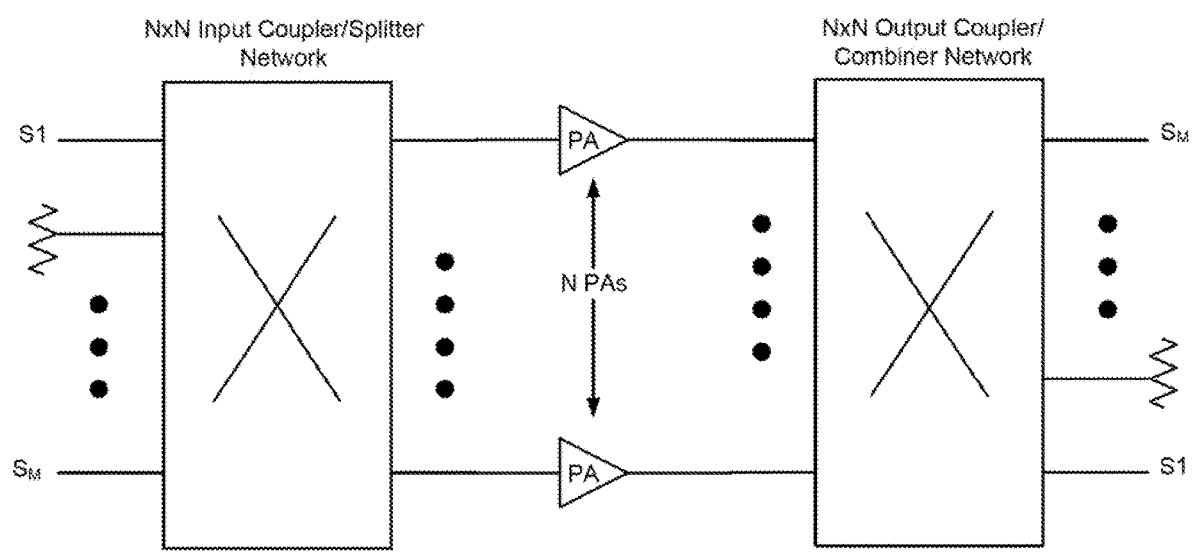
FIG. 8 illustrates a diagram of a generalized trunked amplifier network in accordance with an example.

FIG. 8 illustrates an example of a diagram of a generalized trunked amplifier network. In this example, an N×N input coupler/splitter network can be communicatively coupled to N amplifier networks, where N is equal to a number of trunked or shared amplifier networks (e.g., trunked or shared power amplifiers). The N amplifier networks can be communicatively coupled to an N×N output coupler/combiner network. Further, the N×N input coupler/splitter network can have SM input signals and the N×N output coupler/combiner network can have SM output signals, where M is equal to 1 to N. Further, a number of input port terminations can be equal to a number of output port terminations, which can be equal to N minus M. Further, any terminated output port can be used as an observer port to detect amplifier network faults (or power amplifier faults).

Figure 9A:
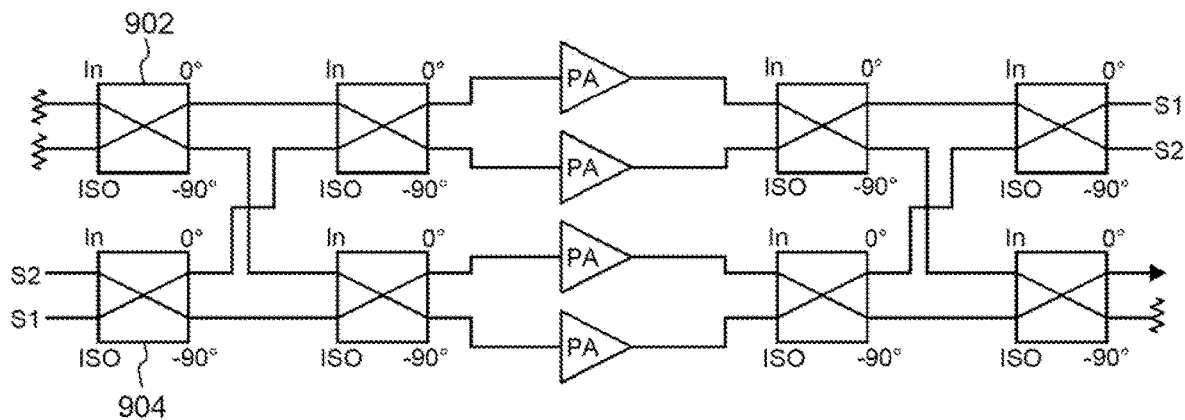
FIGS. 9A, 9B and 9C illustrate input coupler networks and output coupler networks having hybrid couplers with unused port terminations at different locations in accordance with an example.
Figure 9B:
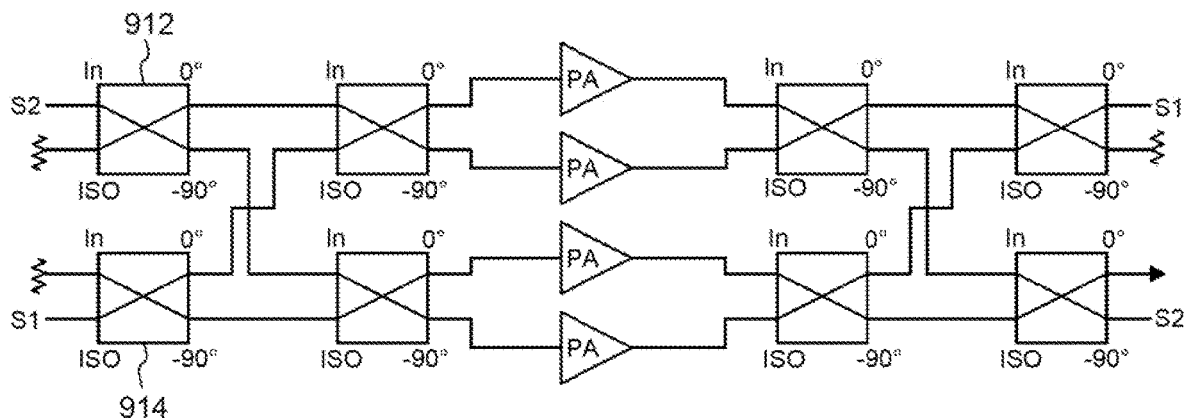
Figure 9C:
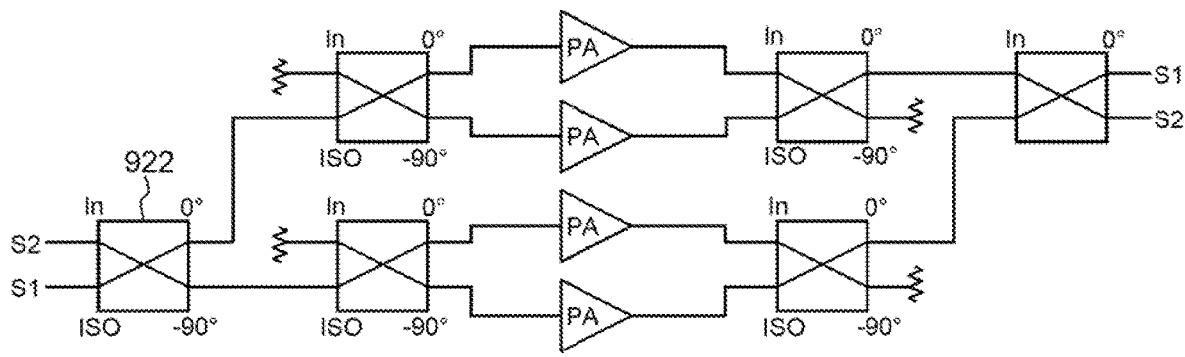

FIGS. 9A, 9B and 9C illustrate examples of input coupler networks and output coupler networks having hybrid couplers with unused port terminations at different locations. When a number of signal inputs (M) is less than a number of amplifier networks or power amplifiers (N), there can be N-M excess input ports. The M input ports can drive any of the N input ports. The different configurations shown in FIGS. 9A, 9B and 9C can have different input drive variants, but can provide an equivalent amplifier network performance.

As shown in FIG. 9A, an input coupler network can include four hybrid couplers, and four power amplifiers can be used. A first hybrid coupler 902 can include a first input port and a second input port, where both the first input port and the second input port can be associated with unused port terminations. A second hybrid coupler 904 can include a first input port and a second input port, where the first input port can be associated with a second signal (S2) in a second band and the second input port can be associated with a first signal (S1) in a first band.

As shown in FIG. 9B, an input coupler network can include four hybrid couplers, and four power amplifiers can be used. A first hybrid coupler 912 can include a first input port and a second input port, where the first input port can be associated with a second signal (S2) in a second band and the second input port can be associated with an unused port termination. A second hybrid coupler 914 can include a first input port and a second input port, where the first input port can be associated with an unused port termination and the second input port can be associated with a first signal (S1) in a first band.

As shown in FIG. 9C, an input coupler network can include three hybrid couplers, and four power amplifiers can be used. A hybrid coupler 922 can include a first input port and a second input port, where the first input port can be associated with a second signal (S2) in a second band and the second input port can be associated with a first signal (S1) in a first band.

Figure 10:
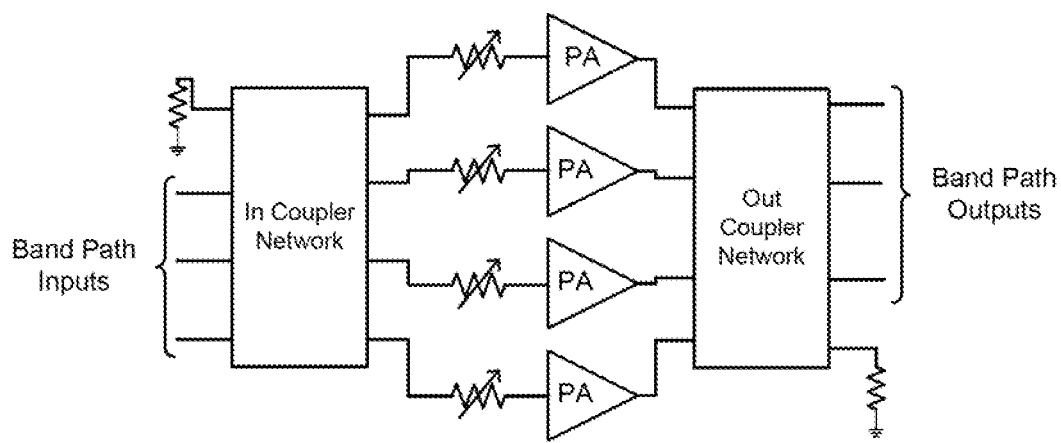
FIG. 10 illustrates one or more attenuators between an input coupler network and a set of amplifier networks in a repeater in accordance with an example.

FIG. 10 illustrates an example of one or more attenuators between an input coupler network and a set of amplifier networks in a repeater. In this example, the input coupler network can include three band path inputs and an output coupler network in the repeater can include three band path outputs. The input coupler network can include four output ports that are communicatively coupled to four amplifier networks (or four power amplifiers), respectively. For example, a first output port of the input coupler network can be communicatively coupled to a first amplifier network, a second output port of the input coupler network can be communicatively coupled to a second amplifier network, a third output port of the input coupler network can be communicatively coupled to a third amplifier network, and a fourth output port of the input coupler network can be communicatively coupled to a fourth amplifier network. The four amplifier networks can be communicatively coupled to the output coupler network.

In one example, imbalanced amplifier network (or power amplifier) gains can result in imbalanced output powers that do not achieve the increased power objective. To balance gains, attenuators can be inserted between the input coupler network and the four amplifier networks. In this example, a first attenuator can be placed between the first output port of the input coupler network and the first amplifier network, a second attenuator can be placed between the second output port of the input coupler network and the second amplifier network, a third attenuator can be placed between the third output port of the input coupler network and the third amplifier network, and a fourth attenuator can be placed between the fourth output port of the input coupler network and the fourth amplifier network. In one example, the attenuators can be digital step attenuators (DSAs) or fixed switch attenuators. In another example, to balance gains, a bias adjust can be used on each amplifier network (or power amplifier), or a switched capacitor bank can be used to adjust each amplifier network's input match.

Figure 11:
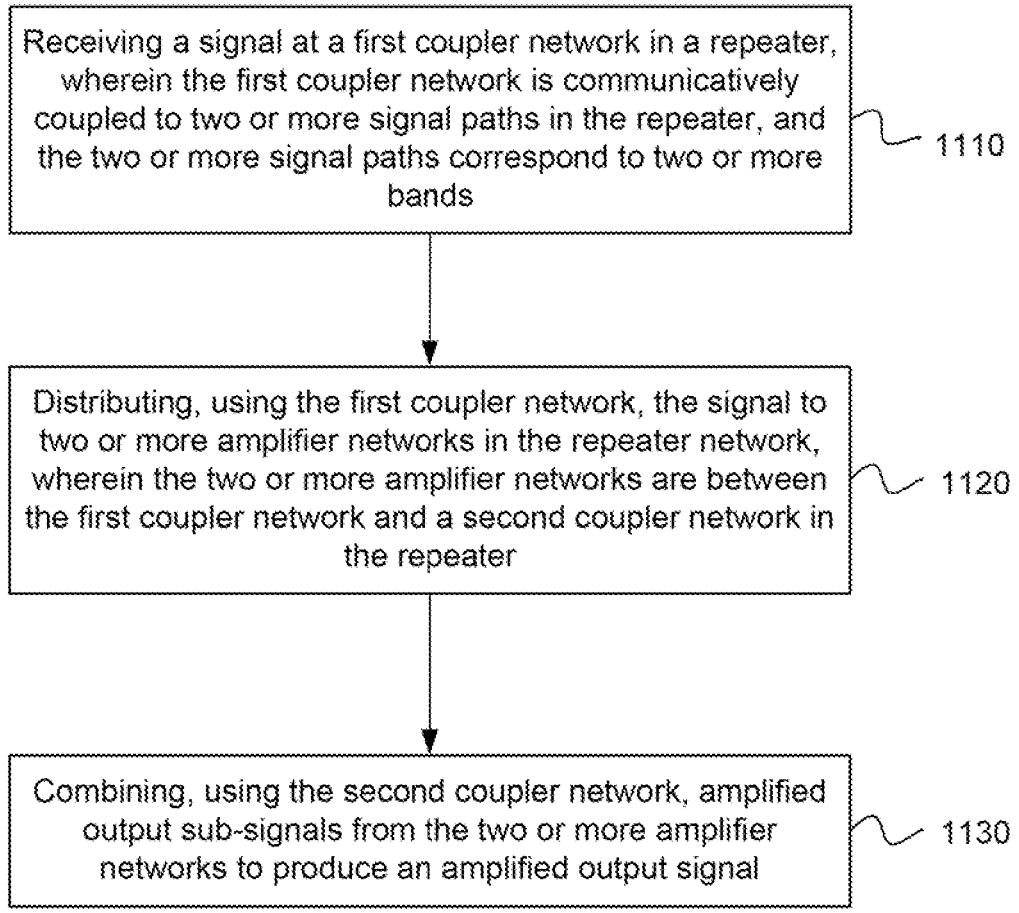
FIG. 11 is a flowchart illustrating operations for amplifying signals in accordance with an example.

FIG. 11 is a flowchart illustrating a method for amplifying signals. The method can be executed as instructions on a machine, where the instructions are included on at least one computer readable medium or one non-transitory machine readable storage medium. The method can include the operation of: receiving a signal at a first coupler network in a repeater, wherein the first coupler network is communicatively coupled to two or more signal paths in the repeater, and the two or more signal paths correspond to two or more bands, as in block 1110. The method can include the operation of: distributing, using the first coupler network, the signal to two or more amplifier networks in the repeater network, wherein the two or more amplifier networks are between the first coupler network and a second coupler network in the repeater, as in block 1120. The method can include the operation of: combining, using the second coupler network, amplified output sub-signals from the two or more amplifier networks to produce an amplified output signal, as in block 1130.

Figure 12:
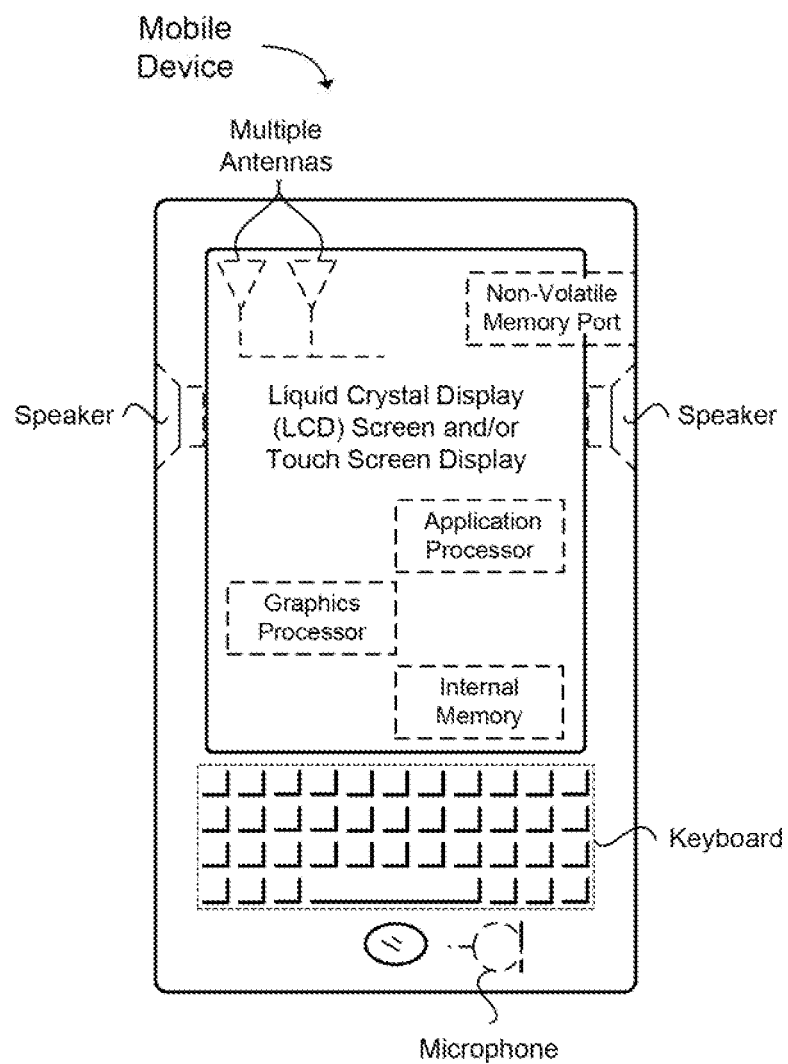
FIG. 12 illustrates a wireless device in accordance with an example.

FIG. 12 provides an example illustration of the wireless device, such as a user equipment (UE), a mobile station (MS), a mobile communication device, a tablet, a handset, a wireless transceiver coupled to a processor, or other type of wireless device. The wireless device can include one or more antennas configured to communicate with a node or transmission station, such as an access point (AP), a base station (BS), an evolved Node B (eNB), a baseband unit (BBU), a remote radio head (RRH), a remote radio equipment (RRE), a relay station (RS), a radio equipment (RE), a remote radio unit (RRU), a central processing module (CPM), or other type of wireless wide area network (WWAN) access point. The wireless device can communicate using separate antennas for each wireless communication standard or shared antennas for multiple wireless communication standards. The wireless device can communicate in a wireless local area network (WLAN), a wireless personal area network (WPAN), and/or a WWAN.

FIG. 12 also provides an illustration of a microphone and one or more speakers that can be used for audio input and output from the wireless device. The display screen can be a liquid crystal display (LCD) screen, or other type of display screen such as an organic light emitting diode (OLED) display. The display screen can be configured as a touch screen. The touch screen can use capacitive, resistive, or another type of touch screen technology. An application processor and a graphics processor can be coupled to internal memory to provide processing and display capabilities. A non-volatile memory port can also be used to provide data input/output options to a user. The non-volatile memory port can also be used to expand the memory capabilities of the wireless device. A keyboard can be with the wireless device or wirelessly connected to the wireless device to provide additional user input. A virtual keyboard can also be provided using the touch screen.

EXAMPLES

The following examples pertain to specific technology embodiments and point out specific features, elements, or actions that can be used or otherwise combined in achieving such embodiments.

Example 1 includes a repeater, comprising: two or more signal paths corresponding to two or more bands; a first coupler network communicatively coupled to the two or more signal paths; a second coupler network communicatively coupled to an antenna port; and two or more amplifier networks between the first coupler network and the second coupler network, wherein a signal received via the first coupler network is distributed to the two or more amplifier networks for amplification and combined using the second coupler network to produce an amplified output signal.

Example 2 includes the repeater of Example 1, wherein the first coupler network includes one or more hybrid couplers and the second coupler network includes one or more hybrid couplers.

Example 3 includes the repeater of any of Examples 1 to 2, wherein one or more of the first coupler network and the second coupler network further includes additional directional coupler structures with coupling values other than 3 decibels (dB) and phase shifts other than ±90 degrees or ±180 degrees. Example 4 includes the repeater of any of Examples 1 to 3, wherein: the first coupler network includes: a first hybrid coupler having a first input port, and a second input port; a second hybrid coupler having a third input port, and a fourth input port; a third hybrid coupler communicatively coupled to the first hybrid coupler and the second hybrid coupler, wherein outputs of the third hybrid coupler are communicatively coupled to a first set of amplifier networks; and a fourth hybrid coupler communicatively coupled to the first hybrid coupler and the second hybrid coupler, wherein outputs of the fourth hybrid coupler are communicatively coupled to a second set of amplifier networks; and the second coupler network includes: a fifth hybrid coupler having a first output port, and a second output port; a sixth hybrid coupler having a third output port, and a fourth output port; a seventh hybrid coupler communicatively coupled to the fifth hybrid coupler and the sixth hybrid coupler, wherein inputs of the seventh hybrid coupler are communicatively coupled to the first set of amplifier networks; and an eighth hybrid coupler communicatively coupled to the fifth hybrid coupler and the sixth hybrid coupler, wherein inputs of the eighth hybrid coupler are communicatively coupled to the second set of amplifier networks.

Example 5 includes the repeater of any of Examples 1 to 4, wherein: the first input port is associated with a first band; the second input port is associated with a second band; the third input port is associated with a third band; the fourth input port is associated with a fourth band; the first output port is associated with the fourth band; the second output port is associated with the third band; the third output port is associated with the second band; and the fourth output port is associated with the first band.

Example 6 includes the repeater of any of Examples 1 to 5, wherein one or more of the first input port, the second input port, the third input port, the fourth input port, the first output port, the second output port, the third output port, or the fourth output port is configured to be terminated with a system impedance.

Example 7 includes the repeater of any of Examples 1 to 6, wherein one or more of: the first input port and the fourth output port are configured to be terminated with a system impedance; the second input port and the third output port are configured to be terminated with a system impedance; the third input port and the second output port are configured to be terminated with a system impedance; or the fourth input port and the first output port are configured to be terminated with a system impedance.

Example 8 includes the repeater of any of Examples 1 to 7, wherein one or more of the first output port, the second output port, the third output port, or the fourth output port are configured to be terminated with a system impedance, and one or more of the first output port, the second output port, the third output port, or the fourth output port are used to detect an amplifier network fault.

Example 9 includes the repeater of any of Examples 1 to 8, wherein the first coupler network is an input splitting network and the second coupler network is an output combining network.

Example 10 includes the repeater of any of Examples 1 to 9, further comprising one or more communication ports communicatively coupled to the two or more signal paths, wherein the antenna port is a donor antenna port, and the two or more signal paths are uplink signal paths communicatively coupled to a modem via the one or more communication ports.

Example 11 includes the repeater of any of Examples 1 to 10, wherein a number of the two or more signal paths is equal to M and a number of the shared PAs is equal to N, wherein M is less than or equal to N, and M and N are positive integers that are greater than or equal to two.

Example 12 includes the repeater of any of Examples 1 to 11, wherein a signal path in the two or more signal paths includes a switch that is opened to enable a signal to pass through the signal path, or is closed to terminate the signal path with a matched load to enable the first coupler network and the second coupler network to continue operating for other bands.

Example 13 includes the repeater of any of Examples 1 to 12, wherein the amplified output signal has a power output of approximately 30 decibel-milliwatts (dBm) per band in accordance with a maximum allowable limit under 47 Code of Federal Regulations (CFR) Section 20.21.

Example 14 includes the repeater of any of Examples 1 to 13, wherein the two or more signals paths are associated with low bands or the two or more signal paths are associated with high bands, wherein the low bands include one or more of band 12 (B12), band 13 (B13), band 71 (B71), or band 5 (B5), and the high bands include one or more of band 25 (B25) or band 66 (B66).

Example 15 includes the repeater of any of Examples 1 to 14, further comprising one or more attenuators between the first coupler network and the two or more amplifier networks to balance gains from the two or more amplifier networks.

Example 16 includes the repeater of any of Examples 1 to 15, wherein an amplifier network in the two or more amplifier networks includes one of: a gain block, a power amplifier or a low noise amplifier (LNA).

Example 17 includes a trunked amplifier network, comprising: a first coupler network comprising two or more input ports and two or more output ports, wherein the two or more input ports are communicatively coupled to two or more signal paths corresponding to two or more bands; a second coupler network comprising two or more input ports and two or more output ports, wherein the two or more output ports are communicatively coupled to two or more signal paths corresponding to two or more bands; and two or more amplifier networks between the first coupler network and the second coupler network, wherein the two or more amplifier networks are communicatively coupled between the one or more output ports of the first coupler network and the one or more input ports of the second coupler network, and a signal received at the first coupler network is distributed to the two or more amplifier networks for amplification and combined using the second coupler network to produce an output signal amplified by the two or more amplifier networks.

Example 18 includes the trunked amplifier network of Example 17, wherein the first coupler network includes one or more hybrid couplers and the second coupler network includes one or more hybrid couplers.

Example 19 includes the trunked amplifier network of any of Examples 17 to 18, wherein one or more of the first coupler network and the second coupler network further include additional directional coupler structures with coupling values other than 3 decibels (dB) and phase shifts other than ±90 degrees or ±180 degrees.

Example 20 includes the trunked amplifier network of any of Examples 17 to 19, wherein: the first coupler network includes: a first hybrid coupler having a first input port, and a second input port; a second hybrid coupler having a third input port, and a fourth input port; a third hybrid coupler communicatively coupled to the first hybrid coupler and the second hybrid coupler, wherein outputs of the third hybrid coupler are communicatively coupled to a first set of amplifier networks; and a fourth hybrid coupler communicatively coupled to the first hybrid coupler and the second hybrid coupler, wherein outputs of the fourth hybrid coupler are communicatively coupled to a second set of amplifier networks; and the second coupler network includes: a fifth hybrid coupler having a first output port, and a second output port; a sixth hybrid coupler having a third output port, and a fourth output port; a seventh hybrid coupler communicatively coupled to the fifth hybrid coupler and the sixth hybrid coupler, wherein inputs of the seventh hybrid coupler are communicatively coupled to the first set of amplifier networks; and an eighth hybrid coupler communicatively coupled to the fifth hybrid coupler and the sixth hybrid coupler, wherein inputs of the eighth hybrid coupler are communicatively coupled to the second set of amplifier networks.

Example 21 includes the trunked amplifier network of any of Examples 17 to 20, wherein: the first input port is associated with a first band; the second input port is associated with a second band; the third input port is associated with a third band; the fourth input port is associated with a fourth band; the first output port is associated with the fourth band; the second output port is associated with the third band; the third output port is associated with the second band; and the fourth output port is associated with the first band.

Example 22 includes the trunked amplifier network of any of Examples 17 to 21, wherein one or more of the first input port, the second input port, the third input port, the fourth input port, the first output port, the second output port, the third output port, or the fourth output port is configured to be terminated with a system impedance.

Example 23 includes the trunked amplifier network of any of Examples 17 to 22, wherein one or more of: the first input port and the fourth output port are configured to be terminated with a system impedance; the second input port and the third output port are configured to be terminated with a system impedance; the third input port and the second output port are configured to be terminated with a system impedance; or the fourth input port and the first output port are configured to be terminated with a system impedance.

Example 24 includes the trunked amplifier network of any of Examples 17 to 23, wherein the first coupler network is an input splitting network and the second coupler network is an output combining network.

Example 25 includes the trunked amplifier network of any of Examples 17 to 24, wherein a number of the two or more signal paths is equal to M and a number of the shared PAs is equal to N, wherein M is less than or equal to N, and M and N are positive integers greater than or equal to two.

Example 26 includes the trunked amplifier network of any of Examples 17 to 25, wherein the amplified output signal has a power output of approximately 30 decibel-milliwatts (dBm) per band in accordance with a maximum allowable limit under 47 Code of Federal Regulations (CFR) Section 20.21.

Example 27 includes a method for amplifying signals, comprising: receiving a signal at a first coupler network in a repeater, wherein the first coupler network is communicatively coupled to two or more signal paths in the repeater, and the two or more signal paths correspond to two or more bands; distributing, using the first coupler network, the signal to two or more amplifier networks in the repeater network, wherein the two or more amplifier networks are between the first coupler network and a second coupler network in the repeater; and combining, using the second coupler network, amplified output signals from the two or more amplifier networks to produce an amplified output signal.

Example 28 includes the method of Example 27, wherein the first coupler network includes one or more hybrid couplers and the second coupler network includes one or more hybrid couplers.

Example 29 includes the method of any of Examples 27 to 28, wherein the first coupler network is an input splitting network and the second coupler network is an output combining network.

Example 30 includes the method of any of Examples 27 to 29, wherein a number of the two or more signal paths is equal to M and a number of the shared PAs is equal to N, wherein M is less than or equal to N, and M and N are positive integers that are greater than or equal to two.

Example 31 includes the method of any of Examples 27 to 30, further comprising: balancing gains from the two or more amplifier networks using one or more attenuators between the first coupler network and the two or more amplifier networks.

Various techniques, or certain aspects or portions thereof, can take the form of program code (i.e., instructions) embodied in tangible media, such as floppy diskettes, compact disc-read-only memory (CD-ROMs), hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a random-access memory (RAM), erasable programmable read only memory (EPROM), flash drive, optical drive, magnetic hard drive, solid state drive, or other medium for storing electronic data. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations.

As used herein, the term processor can include general purpose processors, specialized processors such as VLSI, FPGAs, or other types of specialized processors, as well as base band processors used in transceivers to send, receive, and process wireless communications.

It should be understood that many of the functional units described in this specification have been labeled as modules, in order to more particularly emphasize their implementation independence. For example, a module can be implemented as a hardware circuit comprising custom very-large-scale integration (VLSI) circuits or gate arrays, off-the-shelf semiconductors such as logic chips, transistors, or other discrete components. A module can also be implemented in programmable hardware devices such as field programmable gate arrays, programmable array logic, programmable logic devices or the like.

In one example, multiple hardware circuits or multiple processors can be used to implement the functional units described in this specification. For example, a first hardware circuit or a first processor can be used to perform processing operations and a second hardware circuit or a second processor (e.g., a transceiver or a baseband processor) can be used to communicate with other entities. The first hardware circuit and the second hardware circuit can be incorporated into a single hardware circuit, or alternatively, the first hardware circuit and the second hardware circuit can be separate hardware circuits.

Modules can also be implemented in software for execution by various types of processors. An identified module of executable code can, for instance, comprise one or more physical or logical blocks of computer instructions, which can, for instance, be organized as an object, procedure, or function. Nevertheless, the executables of an identified module need not be physically located together, but can comprise disparate instructions stored in different locations which, when joined logically together, comprise the module and achieve the stated purpose for the module.

Indeed, a module of executable code can be a single instruction, or many instructions, and can even be distributed over several different code segments, among different programs, and across several memory devices. Similarly, operational data can be identified and illustrated herein within modules, and can be embodied in any suitable form and organized within any suitable type of data structure. The operational data can be collected as a single data set, or can be distributed over different locations including over different storage devices, and can exist, at least partially, merely as electronic signals on a system or network. The modules can be passive or active, including agents operable to perform desired functions.

Reference throughout this specification to "an example" or "exemplary" means that a particular feature, structure, or characteristic described in connection with the example is included in at least one embodiment of the present invention. Thus, appearances of the phrases "in an example" or the word "exemplary" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as defacto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of layouts, distances, network examples, etc., to provide a thorough understanding of embodiments of the invention. One skilled in the relevant art will recognize, however, that the invention can be practiced without one or more of the specific details, or with other methods, components, layouts, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A repeater with a trunked amplifier network, comprising:
   two or more signal paths corresponding to two or more bands;
   a first coupler network communicatively coupled to the two or more signal paths;
   a second coupler network communicatively coupled to an antenna port; and
   two or more amplifier networks between the first coupler network and the second coupler network, wherein a signal received via the first coupler network is distributed to the two or more amplifier networks for amplification and combined using the second coupler network to produce an amplified output signal;
   wherein a number of the two or more signal paths is equal to M and a number of the two or more amplifier networks is equal to N, wherein M is less than or equal to N, and M and N are positive integers that are greater than or equal to two.

2. The repeater of claim 1, wherein the first coupler network includes one or more hybrid couplers and the second coupler network includes one or more hybrid couplers.

3. The repeater of claim 1, wherein one or more of the first coupler network and the second coupler network includes directional coupler structures with coupling values other than 3 decibels (dB) and phase shifts other than ±90 degrees or ±180 degrees.

4. The repeater of claim 1, wherein:
   the first coupler network includes:
   a first hybrid coupler having a first input port, and a second input port;
   a second hybrid coupler having a third input port, and a fourth input port;
   a third hybrid coupler communicatively coupled to the first hybrid coupler and the second hybrid coupler, wherein outputs of the third hybrid coupler are communicatively coupled to a first set of amplifier networks; and
   a fourth hybrid coupler communicatively coupled to the first hybrid coupler and the second hybrid coupler, wherein outputs of the fourth hybrid coupler are communicatively coupled to a second set of amplifier networks; and
   the second coupler network includes:
   a fifth hybrid coupler having a first output port, and a second output port;

a sixth hybrid coupler having a third output port, and a fourth output port;

a seventh hybrid coupler communicatively coupled to the fifth hybrid coupler and the sixth hybrid coupler, wherein inputs of the seventh hybrid coupler are communicatively coupled to the first set of amplifier networks; and an eighth hybrid coupler communicatively coupled to the fifth hybrid coupler and the sixth hybrid coupler, wherein inputs of the eighth hybrid coupler are communicatively coupled to the second set of amplifier networks.

5. The repeater of claim 4, wherein:
the first input port is associated with a first band;
the second input port is associated with a second band;
the third input port is associated with a third band;
the fourth input port is associated with a fourth band;
the first output port is associated with the fourth band;
the second output port is associated with the third band;
the third output port is associated with the second band; and
the fourth output port is associated with the first band.

6. The repeater of claim 4, wherein one or more of the first input port, the second input port, the third input port, the fourth input port, the first output port, the second output port, the third output port, or the fourth output port is configured to be terminated with a system impedance.

7. The repeater of claim 4, wherein one or more of:
the first input port and the fourth output port are configured to be terminated with a system impedance;
the second input port and the third output port are configured to be terminated with a system impedance;
the third input port and the second output port are configured to be terminated with a system impedance; or
the fourth input port and the first output port are configured to be terminated with a system impedance.

8. The repeater of claim 4, wherein one or more of the first output port, the second output port, the third output port, or the fourth output port are configured to be terminated with a system impedance, and one or more of the first output port, the second output port, the third output port, or the fourth output port are used to detect an amplifier network fault.

9. The repeater of claim 1, wherein the first coupler network is an input splitting network and the second coupler network is an output combining network.

10. The repeater of claim 1, further comprising one or more communication ports communicatively coupled to the two or more signal paths, wherein the antenna port is a donor antenna port, and the two or more signal paths are uplink signal paths communicatively coupled to a modem via the one or more communication ports.

11. The repeater of claim 1, wherein a signal path in the two or more signal paths includes a switch that is opened to enable a signal to pass through the signal path, or is closed to terminate the signal path with a matched load to enable the first coupler network and the second coupler network to continue operating for other bands.

12. The repeater of claim 1, wherein the amplified output signal has a power output of approximately 30 decibel-milliwatts (dBm) per band in accordance with a maximum allowable limit under 47 Code of Federal Regulations (CFR) Section 20.21.

13. The repeater of claim 1, wherein the two or more signals paths are associated with low bands or the two or more signal paths are associated with high bands, wherein the low bands include one or more of band 12 (B12), band 13 (B13), band 71 (B71), or band 5 (B5), and the high bands include one or more of band 25 (B25) or band 66 (B66).

14. The repeater of claim 1, further comprising one or more attenuators between the first coupler network and the two or more amplifier networks to balance gains from the two or more amplifier networks.

15. The repeater of claim 1, wherein an amplifier network in the two or more amplifier networks includes one of: a gain block, a power amplifier or a low noise amplifier (LNA).

16. A trunked amplifier network, comprising:
a first coupler network comprising two or more input ports and two or more output ports, wherein the two or more input ports are communicatively coupled to two or more signal paths corresponding to two or more bands;
a second coupler network comprising two or more input ports and two or more output ports, wherein the two or more output ports are communicatively coupled to two or more signal paths corresponding to two or more bands; and
two or more amplifier networks between the first coupler network and the second coupler network, wherein the two or more amplifier networks are communicatively coupled between the one or more output ports of the first coupler network and the one or more input ports of the second coupler network, and a signal received at the first coupler network is distributed to the two or more amplifier networks for amplification and combined using the second coupler network to produce an output signal amplified by the two or more amplifier networks;
wherein a number of the two or more signal paths is equal to M and a number of the two or more amplifier networks is equal to N, wherein M is less than or equal to N, and M and N are positive integers greater than or equal to two.

17. The trunked amplifier network of claim 16, wherein the first coupler network includes one or more hybrid couplers and the second coupler network includes one or more hybrid couplers.

18. The trunked amplifier network of claim 17, wherein one or more of the first coupler network and the second coupler network further includes additional directional coupler structures with coupling values other than 3 decibels (dB) and phase shifts other than ±90 degrees or ±180 degrees.

19. The trunked amplifier network of claim 16, wherein:
the first coupler network includes:
a first hybrid coupler having a first input port, and a second input port;
a second hybrid coupler having a third input port, and a fourth input port;
a third hybrid coupler communicatively coupled to the first hybrid coupler and the second hybrid coupler, wherein outputs of the third hybrid coupler are communicatively coupled to a first set of amplifier networks; and
a fourth hybrid coupler communicatively coupled to the first hybrid coupler and the second hybrid coupler, wherein outputs of the fourth hybrid coupler are communicatively coupled to a second set of amplifier networks; and
the second coupler network includes:
a fifth hybrid coupler having a first output port, and a second output port;
a sixth hybrid coupler having a third output port, and a fourth output port;

a seventh hybrid coupler communicatively coupled to the fifth hybrid coupler and the sixth hybrid coupler, wherein inputs of the seventh hybrid coupler are communicatively coupled to the first set of amplifier networks; and an eighth hybrid coupler communicatively coupled to the fifth hybrid coupler and the sixth hybrid coupler, wherein inputs of the eighth hybrid coupler are communicatively coupled to the second set of amplifier networks.

20. The trunked amplifier network of claim 19, wherein:
the first input port is associated with a first band;
the second input port is associated with a second band;
the third input port is associated with a third band;
the fourth input port is associated with a fourth band;
the first output port is associated with the fourth band;
the second output port is associated with the third band;
the third output port is associated with the second band; and
the fourth output port is associated with the first band.

21. The trunked amplifier network of claim 19, wherein one or more of the first input port, the second input port, the third input port, the fourth input port, the first output port, the second output port, the third output port, or the fourth output port is configured to be terminated with a system impedance.

22. The trunked amplifier network of claim 19, wherein one or more of:
the first input port and the fourth output port are configured to be terminated with a system impedance;
the second input port and the third output port are configured to be terminated with a system impedance;
the third input port and the second output port are configured to be terminated with a system impedance; or
the fourth input port and the first output port are configured to be terminated with a system impedance.

23. The trunked amplifier network of claim 16, wherein the first coupler network is an input splitting network and the second coupler network is an output combining network.

24. The trunked amplifier network of claim 16, wherein the amplified output signal has a power output of approximately 30 decibel-milliwatts (dBm) per band in accordance with a maximum allowable limit under 47 Code of Federal Regulations (CFR) Section 20.21.

25. A method for amplifying signals with a trunked amplifier network, comprising:
receiving a signal at a first coupler network in a repeater, wherein the first coupler network is communicatively coupled to two or more signal paths in the repeater, and the two or more signal paths correspond to two or more bands;
distributing, using the first coupler network, the signal to two or more amplifier networks in the repeater network, wherein the two or more amplifier networks are between the first coupler network and a second coupler network in the repeater; and
combining, using the second coupler network, amplified output sub-signals from the two or more amplifier networks to produce an amplified output signal;
wherein a number of the two or more signal paths is equal to M and a number of the two or more amplifier networks is equal to N, wherein M is less than or equal to N, and M and N are positive integers that are greater than or equal to two.

26. The method of claim 25, wherein the first coupler network includes one or more hybrid couplers and the second coupler network includes one or more hybrid couplers.

27. The method of claim 25, wherein the first coupler network is an input splitting network and the second coupler network is an output combining network.

28. The method of claim 25, further comprising: balancing gains from the two or more amplifier networks using one or more attenuators between the first coupler network and the two or more amplifier networks.

* * * * *